United States Patent
Roohparvar et al.

(10) Patent No.: US 6,490,701 B1
(45) Date of Patent: Dec. 3, 2002

(54) INTEGRATED CIRCUIT TEST MODE WITH EXTERNALLY FORCED REFERENCE VOLTAGE

(75) Inventors: Frankie Fariborz Roohparvar, Cupertino, CA (US); A. Papaliolios, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 88 days.

(21) Appl. No.: 09/641,065

(22) Filed: Aug. 17, 2000

Related U.S. Application Data

(63) Continuation of application No. 09/021,244, filed on Feb. 10, 1998, now Pat. No. 6,119,252.

(51) Int. Cl.$^7$ .............................. G11C 29/00; G11C 7/00
(52) U.S. Cl. ........................................ 714/721; 365/201
(58) Field of Search ........................ 714/721; 365/200, 365/201

(56) References Cited

U.S. PATENT DOCUMENTS

| | | | | |
|---|---|---|---|---|
| 4,612,630 A | | 9/1986 | Rosier ........................ 365/201 |
| 4,779,272 A | | 10/1988 | Kohda et al. ................. 371/21 |
| 4,800,332 A | | 1/1989 | Hutchins ..................... 324/73 |
| 5,155,704 A | | 10/1992 | Walther et al. ............. 365/201 |
| 5,260,643 A | | 11/1993 | Sandhu ....................... 323/225 |
| 5,299,163 A | | 3/1994 | Mortigami .................. 365/201 |
| 5,331,599 A | | 7/1994 | Yero .......................... 365/226 |
| 5,349,559 A | * | 9/1994 | Park et al. .................. 365/201 |
| 5,363,333 A | * | 11/1994 | Tsujimoto .................. 365/201 |
| 5,424,975 A | | 6/1995 | Lowrey ...................... 365/145 |
| 5,452,253 A | * | 9/1995 | Choi .......................... 365/201 |
| 5,493,572 A | * | 2/1996 | Hori et al. ................... 714/724 |
| 5,526,364 A | | 6/1996 | Roohparvar ................ 371/22.1 |
| 5,636,166 A | | 6/1997 | Roohparvar ................ 365/194 |
| 5,661,690 A | * | 8/1997 | Roohparvar ................ 365/201 |
| 5,710,778 A | * | 1/1998 | Bettman et al. ............. 714/725 |
| 5,768,290 A | * | 6/1998 | Akamatsu ................... 714/732 |
| 5,917,765 A | * | 6/1999 | Morishita et al. ........... 365/201 |
| 5,956,277 A | * | 9/1999 | Roohparvar ................ 365/201 |
| 6,052,321 A | * | 4/2000 | Roohparvar ................ 365/201 |
| 6,119,252 A | * | 9/2000 | Roohparvar et al. ......... 714/721 |
| 6,226,764 B1 | * | 5/2001 | Lee ............................ 714/718 |
| 6,275,961 B1 | * | 8/2001 | Roohparvar ................ 714/718 |
| 6,330,697 B1 | * | 12/2001 | Clinton et al. .............. 714/721 |

OTHER PUBLICATIONS

"Flash Memory 2 Meg X 8", *Flash Memory Data Book*, Micron Quantum Devices, Inc., pp. 2–5–2–33 (1996).

\* cited by examiner

*Primary Examiner*—Albert Decady
*Assistant Examiner*—Joseph D. Torres
(74) *Attorney, Agent, or Firm*—Schwegman, Lundberg, Woessner & Kluth, P.A.

(57) ABSTRACT

A memory device is described which includes a latch circuit for latching a normally externally provided signal during a test mode. The input pin which is normally enabled to receive the external signal is re-routed to provide an external reference voltage, Vref, to internal circuitry. During testing operations the external Vref signal is used. Once an integrated circuit is determined to be good, an internal generator circuit is set to provide Vref. The integrated circuit can be a flash memory device, and the input pin can be a BYTE command pin. This method of substituting the source of Vref eliminates time required to set the internal generator circuit in defective memory devices.

36 Claims, 2 Drawing Sheets

INTEGRATED CIRCUIT TEST MODE WITH EXTERNALLY FORCED REFERENCE VOLTAGE

This application is a Continuation of U.S. patent application Ser. No. 09/021,244, filed Feb. 10, 1998 now U.S. Pat. No. 6,119,252.

TECHNICAL FIELD OF THE INVENTION

The present invention relates generally to integrated circuits and in particular the present invention relates to testing integrated circuits having internally generated reference voltages.

BACKGROUND OF THE INVENTION

Integrated circuits, such as memory devices, require extensive testing during fabrication to insure that a finished circuit is fully operational. This testing is performed during various stages of fabrication and may be tested while it is still part of an integrated circuit wafer. This testing is usually performed using an integrated circuit probe card which physically connects a tester to probe pads, and other electrical conductors, provided on each circuit die. The tests performed are numerous and often depend upon the type of device fabricated. These tests are often performed by placing the integrated circuit in a specific test mode of operation. While manufacturers of integrated circuits extensively test their devices using these test modes, it is desired to prohibit an end-user from placing a completed device in a test mode. As such, various methods have been devised to allow testing during manufacturing while prohibiting accidental initiation during use. These methods include, but are not limited to, electronic keys and super voltages, as known to those skilled in the art.

Some integrated circuits include voltage generator circuits which provide an internal reference voltage. For example, an integrated circuit memory device can include an internal circuit for providing a reference voltage. Prior to testing, therefore, the integrated circuit memory device must be capable of providing the internal reference voltage. The voltage generator circuit, however, often requires extensive programming prior to providing a valid reference voltage. This requirement provides a dilemma during testing. That is, a defective memory device must first be programmed to provide the internal reference voltage before it is determined that the memory device is defective. Because the procedure for setting the internal reference voltage requires numerous seconds (up to 20 seconds is common), valuable time is wasted during testing.

For the reasons stated above, and for other reasons stated below which will become apparent to those skilled in the art upon reading and understanding the present specification, there is a need in the art for a method of testing an integrated circuit which does not require an internal reference voltage generator to be set prior to testing.

SUMMARY OF THE INVENTION

The above mentioned problems with integrated circuit testing and other problems are addressed by the present invention and which will be understood by reading and studying the following specification. A method is described which allows an integrated circuit to be tested prior to setting an internal reference voltage generator.

In particular, the present invention describes a method of testing an integrated circuit. The method comprises the steps of placing the integrated circuit in a test mode, decoupling an input connection configured to receive an input command signal, and setting a latch circuit to a predetermined state in response to the test mode to provide a substitute signal for the input command signal. An external reference voltage is coupled to the input connection. The method further comprises testing the integrated circuit using the external reference voltage, and setting an internal reference voltage generator circuit to provide an internal reference voltage if the integrated circuit passes the step of testing.

In another embodiment, a method of testing a flash memory device is described. The method comprises the steps of placing the flash memory device in a test mode in response to signals provided on input connections, decoupling a BYTE input connection configured to receive an input command signal identifying an operating data width, and setting a latch circuit to a predetermined state in response to the test mode to provide a substitute signal for the input command signal. The method further comprises coupling an external reference voltage to the input connection, testing the flash memory device using the external reference voltage, and setting an internal reference voltage generator circuit to provide an internal reference voltage if the flash memory device passes the step of testing.

In yet another embodiment, a memory device comprises an array of memory cells, a control circuit for operating the memory device in a test mode in response to external input signals, a control input pin adapted to receive a control signal during non-test mode operations, and a latch circuit coupled to the control input pin and adapted to provide a substitute signal for the control signal during test mode operation. A programmable reference voltage generator circuit is provided and configured to provide an internal reference voltage. Bypass circuitry is coupled to the control input pin and adapted to receive an externally supplied reference voltage during non-test mode operations. The externally supplied reference voltage is substituted for the internal reference voltage while the programmable reference voltage generator circuit is not programmed.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Flash Memory

Figure 1:
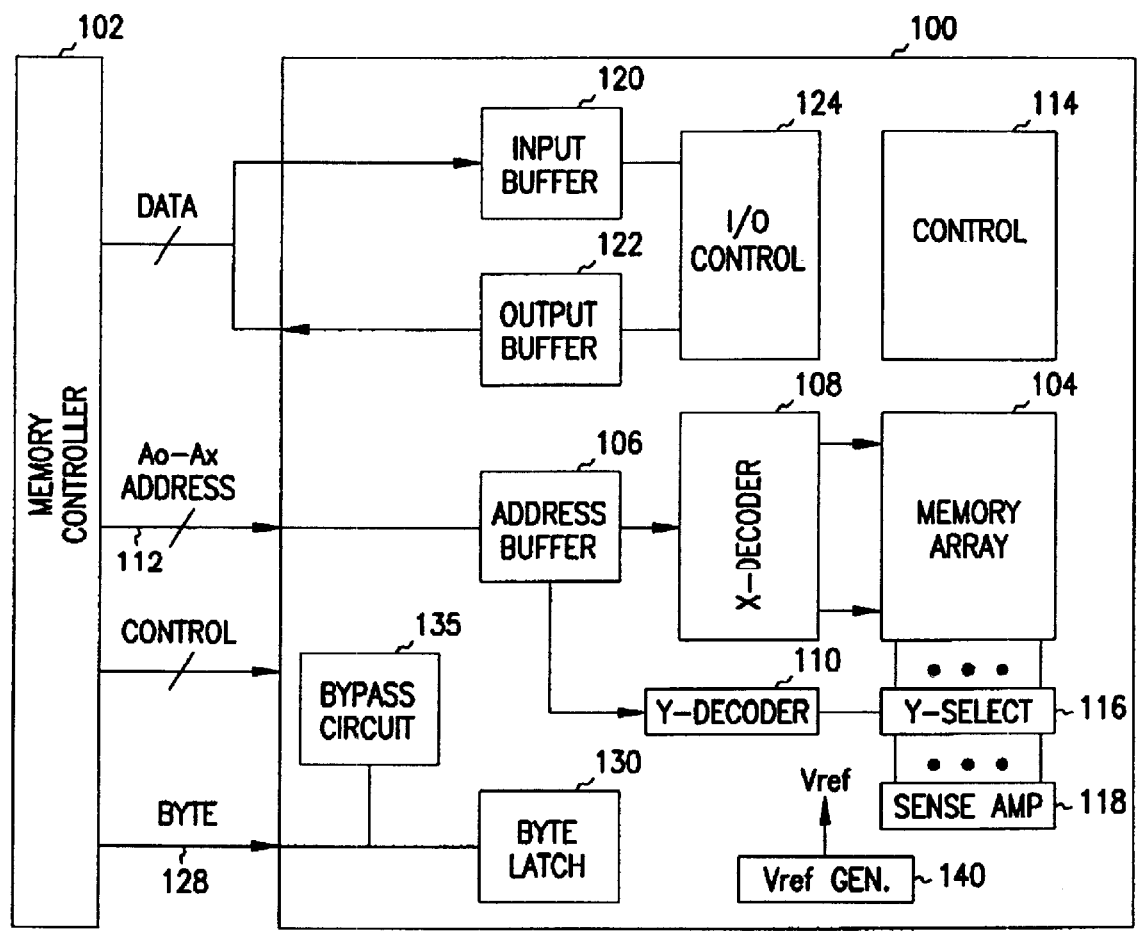
FIG. 1 is a block diagram of a Flash memory device of the present invention.

FIG. 1 illustrates a block diagram of a Flash memory device 100 of the present invention which is coupled to a flash controller 102. The memory device has been simplified to focus on features of the memory which are helpful in understanding the present invention. The memory device 100 includes an array of memory cells 104. The memory cells are preferably floating gate memory cells. The array is arranged in rows and columns, with the rows arranged in blocks. The blocks allow memory cells to be erased in large groups. Data, however, is stored in the memory array individually or in small data groups (byte or group of bytes) and separate from the block structure. Erase operations are performed on a large number of cells in parallel.

An x-decoder 108 and a y-decoder 110 are provided to decode address signals provided on address lines A0–Ax 112. Address signals are received and decoded to access the memory array 104. An address buffer circuit 106 is provided to latch the address signals. A y-select circuit 116 is provided to select a column of the array identified with the y-decoder 110. Sense amplifier and compare circuitry 118 is used to sense data stored in the memory cells and verify the accuracy of stored data. Data input 120 and output 122 buffer circuits are included for bidirectional data communication over a plurality of data (DQ) lines with the microprocessor 102. Command control circuit 114 decodes signals provided on control lines from the microprocessor. These signals are used to control the operations of the memory, including data read, data write, and erase operations. Input/output control circuit 124 is used to control the input and output buffers in response to some of the control signals. A BYTE latch 130 is provided for testing the memory, as explained below.

As stated above, the Flash memory of FIG. 1 has been simplified to facilitate a basic understanding of the features of the memory. A more detailed understanding of Flash memories is known to those skilled in the art. See "1997 Flash Memory Data Book" pages 2–5 to 2–33 available from Micron Quantum Devices, Inc. (incorporated herein by reference) for a more detailed description of a Flash memory.

The flash memory device 100 includes a reference voltage generator circuit 140 for providing a Vref signal which is stable over variations in supply voltage and temperature. The voltage generator circuit includes two flash memory cells which have floating gates programmed at different voltages. A voltage difference between the floating gates of the memory cells are used to establish Vref. As such, each memory cell must first be erased prior to setting the internal reference voltage. One of the memory cells is first programmed to have a first floating gate voltage level. The second memory cell is then precisely charged to establish the reference voltage. Because accuracy is important, the second memory cell is programmed with very short pulses of varied duration to eliminate overshoot and undershoot. As stated above, it can take up to 20 seconds to set the voltage generator circuit to provide an accurate Vref. The present invention can be used with any Vref generator circuit, but is more advantageous with a generator circuit that requires time consuming programming.

The present invention allows integrated circuit memory devices to be tested without first programming the internal voltage generator circuit 140. An externally provided Vref signal is used during testing to avoid wasting time programming a reference generator circuit in a defective memory device. Two methods are described herein which allow an externally provided Vref signal to be used during testing.

To initiate a test of the memory device, an externally provided electronic key is provided using any of the memory input connections. This electronic key, as known to those skilled in the art, can include a super voltage provided on an external pin in combination with a specific code provided on address, control or data inputs. The memory control circuit 114 places the memory device in a test mode in response to the electronic key used. When in the test mode, one of the address input pins is used to provide an external Vref voltage. The internal Vref circuit, therefore, is bypassed during the test mode. The memory device is then tested using this external Vref signal. If the memory device is not defective, the internal voltage generator circuit is programmed to provide an internal Vref signal. The memory device is then briefly tested to insure that the voltage generator circuit has been properly set. This method of using an external address pin for providing Vref does not allow the memory device 100 to be fully tested, because one addressed pin is not available for receiving an address signal. A second method of testing the memory device allows for a complete test of the device.

The second method of testing the integrated circuit memory device requires the addition of an internal latch circuit 130. The latch circuit is coupled to an input pin of the memory device, such as the BYTE input pin 128. The BYTE input pin is used to place the memory device in either a x8 or x16 data mode. A signal provided on the BYTE input pin is static and does not change during testing. That is, a signal provided on the BYTE pin is either a one or a zero to establish the data mode desired. Because this pin is not required during operation once the data mode has been set, it is available for use as a Vref input pin. During testing, therefore, the control circuit of the memory device sets the latch circuit 130 in a proper state to establish the data mode as either a x8 or x16 data mode. Once the latch circuit has been set, the BYTE pin is available for receiving an externally provided Vref voltage. Bypass circuitry 135 is provided to couple the BYTE pin to the internal Vref node, such that the BYTE pin provides the Vref signal during testing operations and the latch 130 provides the signal normally received on the BYTE pin.

Figure 2:
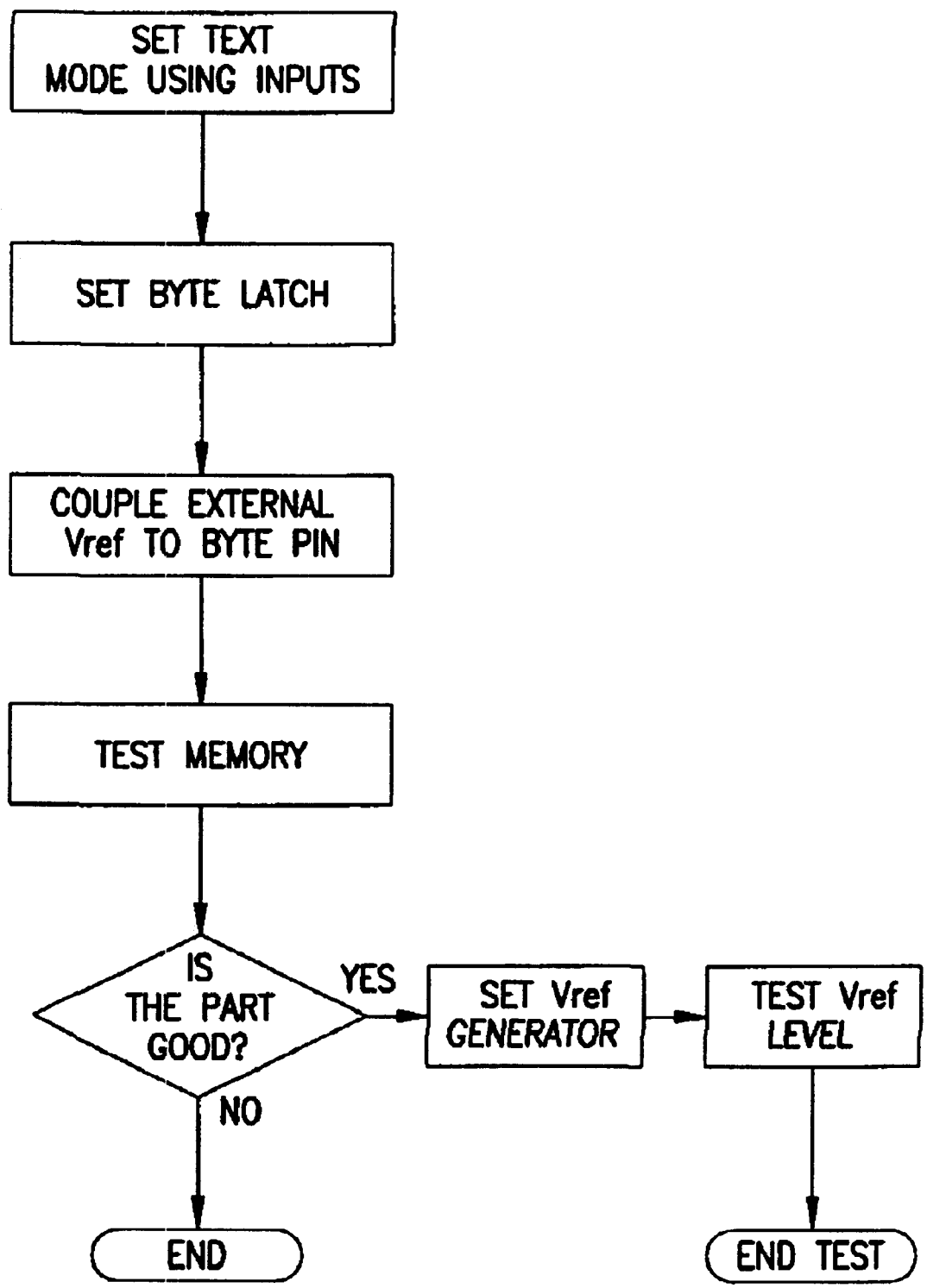
FIG. 2 is a flow chart of a test method of the present invention.

FIG. 2 illustrates a flow chart of a test operation using the BYTE pin. The test mode is first set using memory input pins. This test mode includes a command to set the BYTE latch to the desired state. An external Vref signal is then coupled to internal circuitry via the BYTE pin. The part is tested using this Vref voltage. If the device is defective, the test is terminated. If the part is good, however, the internal Vref generator circuit is set, and the memory is tested to determine if the generator is operating properly. This Vref test can be a short test, such as a data write operation.

It will be appreciated by those skilled in the art that any input pin which does not require continued use during testing, can be used to provided the Vref voltage, and the present invention is not limited to the BYTE pin. To illustrate the advantage of the present invention, the following example is provided.

Assuming that an integrated circuit wafer contains a total of 1,000 die, and that 300 of the die are defective, a substantial time savings is experienced with the present invention. Using the prior method of testing, each integrated circuit die required about 20 seconds to establish an internal Vref voltage. The wafer therefore required 20,000 seconds, or approximately 5.5 hours, before any circuit could be functionally tested. Using the methods of the present invention, the 300 defective die do not require the 20 seconds to establish Vref. As such, 6,000 seconds, or approximately 1.6 hours, of test time is saved per wafer. It will be appreciated that this reduction in test time is significant both in time and cost.

The present invention can be included and used on any integrated circuit or memory device. For example, the flash memory can be replaced with a dynamic random access memory, or a multi-port RAM, commonly referred to as video random access memories (VRAM) or window RAM (WRAM) because of their effectiveness in video systems. Additionally, the memory could be a synchronous DRAM commonly referred to as SGRAM, SDRAM, SDRAM II, and DDR SDRAM, as well as Synchlink or Rambus DRAMs.

CONCLUSION

A memory device has been described which includes a latch circuit for latching a normally externally provided signal during a test mode. The input pin which is normally enabled to receive the external signal is rerouted to provide an external reference voltage, Vref, to internal circuitry. During testing operations the external Vref signal is used. Once an integrated circuit is determined to be good, an internal generator circuit is set to provide Vref. The integrated circuit can be a flash memory device, and the input pin is described in one embodiment as a BYTE command pin. This method of substituting the source of Vref eliminates time required to set the internal generator circuit in defective memory devices.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of operating an integrated circuit comprising:
    coupling an external reference voltage to an input pin of an integrated circuit;
    testing the integrated circuit as the integrated circuit operates using the external reference voltage to determine if the integrated circuit is defective;
    programming an internal reference circuit in the integrated circuit to generate an internal reference voltage if the integrated circuit is not defective; and
    testing the integrated circuit as the integrated circuit operates using the internal reference voltage to determine if the internal reference voltage is proper.

2. The method of claim 1 wherein:
    coupling an external reference voltage comprises coupling an external reference voltage to an address input pin of a flash memory device having an array of floating gate memory cells;
    programming an internal reference circuit comprises programming a first floating gate memory cell and programming a second floating gate memory cell with pulses of varied duration in the internal reference circuit;
    testing the integrated circuit as the integrated circuit operates using the internal reference voltage further comprises writing data to a floating gate memory cell in the flash memory and
    further comprising placing the flash memory device in a test mode with an electronic key coupled to the flash memory device from a controller, the electronic key comprising:
        a supervoltage coupled to an input pin of the flash memory device from the controller; and
        a code generated by the controller and coupled to address lines, control lines, or data lines coupled between the controller and the flash memory device.

3. The method of claim 1 wherein coupling an external reference voltage comprises:
    setting a latch circuit in a flash memory device having an array of floating gate memory cells to select a data width mode for the flash memory device;
    coupling a BYTE input pin to an internal reference node through a bypass circuit in the flash memory device; and
    coupling an external reference voltage to the BYTE input pin in the flash memory device.

4. A method of operating a memory device comprising:
    coupling an external reference voltage to an input pin of a memory device having a plurality of memory cells;
    testing the memory device as the memory device operates using the external reference voltage to determine if the memory device is defective;
    programming an internal reference circuit in the memory device to generate an internal reference voltage if the memory device is not defective; and
    testing the memory device as the memory device operates using the internal reference voltage to determine if the internal reference voltage is proper.

5. The method of claim 4 wherein:
    coupling an external reference voltage comprises coupling an external reference voltage to an address input pin of a flash memory device having an array of floating gate memory cells;
    programming an internal reference circuit comprises programming a first floating gate memory cell and programming a second floating gate memory cell with pulses of varied duration in the internal reference circuit;
    testing the memory device as the memory device operates using the internal reference voltage further comprises writing data to a floating gate memory cell in the flash memory device; and
    further comprising placing the flash memory device in a test mode with an electronic key coupled to the flash memory device from a controller, the electronic key comprising:
        a supervoltage coupled to an input pin of the flash memory device from the controller; and
        a code generated by the controller and coupled to address lines, control lines, or data lines coupled between the controller and the flash memory device.

6. The method of claim 4 wherein coupling an external reference voltage comprises:
    setting a latch circuit in a flash memory device having an array of floating gate memory cells to select a data width mode for the flash memory device;
    coupling a BYTE input pin to an internal reference node through a bypass circuit in the flash memory device; and
    coupling an external reference voltage to the BYTE input pin in the flash memory device.

7. A method of operating a memory device comprising:
    coupling an external reference voltage to an input pin of a flash memory device having a plurality of floating gate memory cells;
    testing the flash memory device as the flash memory device operates using the external reference voltage to determine if the flash memory device is defective;

programming an internal reference circuit in the flash memory device to generate an internal reference voltage if the flash memory device is not defective; and testing the flash memory device as the flash memory device operates using the internal reference voltage to determine if the internal reference voltage is proper.

8. The method of claim 7 wherein:

coupling an external reference voltage comprises coupling an external reference voltage to an address input pin of the flash memory device having an array of the floating gate memory cells;

programming an internal reference circuit comprises programming a first floating gate memory cell and programming a second floating gate memory cell with pulses of varied duration in the internal reference circuit;

testing the memory device as the memory device operates using the internal reference voltage further comprises writing data to a floating gate memory cell in the flash memory device; and further comprising placing the flash memory device in a test mode with an electronic key coupled to the flash memory device from a controller, the electronic key comprising:
  a supervoltage coupled to an input pin of the flash memory device from the controller; and
  a code generated by the controller and coupled to address lines, control lines, or data lines coupled between the controller and the flash memory device.

9. The method of claim 7 wherein coupling an external reference voltage comprises:

setting a latch circuit in the flash memory device having an array of the floating gate memory cells to select a data width mode for the flash memory device;

coupling a BYTE input pin to an internal reference node through a bypass circuit in the flash memory device; and coupling an external reference voltage to the BYTE input pin in the flash memory device.

10. A method of operating a system comprising:

exchanging signals between a controller and an integrated circuit over a plurality of lines coupled between the controller and the integrated circuit;

coupling an external reference voltage to an input pin of the integrated circuit;

testing the integrated circuit as the integrated circuit operates using the external reference voltage to determine if the integrated circuit is defective;

programming an internal reference circuit in the integrated circuit to generate an internal reference voltage if the integrated circuit is not defective; and testing the integrated circuit as the integrated circuit operates using the internal reference voltage to determine if the internal reference voltage is proper.

11. The method of claim 10 wherein:

exchanging signals comprises exchanging address signals over address lines, data signals over data lines, and control signals over control lines coupled between a microprocessor and a flash memory device having an array of floating gate memory cells;

coupling an external reference voltage comprises coupling an external reference voltage to an address input pin of the flash memory device;

programming an internal reference circuit comprises programming a first floating gate memory cell and programming a second floating gate memory cell with pulses of varied duration in the internal reference circuit;

testing the integrated circuit as the integrated circuit operates using the internal reference voltage further comprises writing data to a floating gate memory cell in the flash memory device; and further comprising placing the flash memory device in a test mode with an electronic key coupled to the flash memory device from the microprocessor, the electronic key comprising:
  a supervoltage coupled to an input pin of the flash memory device from the microprocessor; and
  a code generated by the microprocessor and coupled to the address lines, the control lines, or the data lines coupled between the microprocessor and the flash memory device.

12. The method of claim 10 wherein coupling an external reference voltage comprises:

setting a latch circuit in a flash memory device having an array of floating gate memory cells to select a data width mode for the flash memory device;

coupling a BYTE input pin to an internal reference node through a bypass circuit in the flash memory device; and coupling an external reference voltage to the BYTE input pin in the flash memory device from a microprocessor.

13. A method of operating a system comprising:

exchanging signals between a controller and a memory device having a plurality of memory cells over a plurality of lines coupled between the controller and the memory device;

coupling an external reference voltage to an input pin of the memory device;

testing the memory device as the memory device operates using the external reference voltage to determine if the memory device is defective;

programming an internal reference circuit in the memory device to generate an internal reference voltage if the memory device is not defective; and testing the memory device as the memory device operates using the internal reference voltage to determine if the internal reference voltage is proper.

14. The method of claim 13 wherein:

exchanging signals comprises exchanging address signals over address lines, data signals over data lines, and control signals over control lines coupled between a microprocessor and a flash memory device having an array of floating gate memory cells;

coupling an external reference voltage comprises coupling an external reference voltage to an address input pin of the flash memory device;

programming an internal reference circuit comprises programming a first floating gate memory cell and programming a second floating gate memory cell with pulses of varied duration in the internal reference circuit;

testing the memory device as the memory device operates using the internal reference voltage further comprises writing data to a floating gate memory cell in the flash memory device; and further comprising placing the flash memory device in a test mode with an electronic key coupled to the flash memory device from the microprocessor, the electronic key comprising:

a supervoltage coupled to an input pin of the flash memory device from the microprocessor; and a code generated by the microprocessor and coupled to the address lines, the control lines, or the data lines coupled between the microprocessor and the flash memory device.

15. The method of claim 13 wherein coupling an external reference voltage comprises:

setting a latch circuit in a flash memory device having an array of floating gate memory cells to select a data width mode for the flash memory device;

coupling a BYTE input pin to an internal reference node through a bypass circuit in the flash memory device; and coupling an external reference voltage to the BYTE input pin in the flash memory device from a microprocessor.

16. A method of operating a system comprising:

exchanging signals between a controller and a flash memory device having a plurality of floating gate memory cells over a plurality of lines coupled between the controller and the flash memory device;

coupling an external reference voltage to an input pin of the flash memory device;

testing the flash memory device as the flash memory device operates using the external reference voltage to determine if the flash memory device is defective;

programming an internal reference circuit in the flash memory device to generate an internal reference voltage if the flash memory device is not defective; and testing the flash memory device as the flash memory device operates using the internal reference voltage to determine if the internal reference voltage is proper.

17. The method of claim 16 wherein:

exchanging signals comprises exchanging address signals over address lines, data signals over data lines, and control signals over control lines coupled between a microprocessor and the flash memory device having an array of the floating gate memory cells;

coupling an external reference voltage comprises coupling an external reference voltage to an address input pin of the flash memory device;

programming an internal reference circuit comprises programming a first floating gate memory cell and programming a second floating gate memory cell with pulses of varied duration in the internal reference circuit;

testing the memory device as the memory device operates using the internal reference voltage further comprises writing data to a floating gate memory cell in the flash memory device; and further comprising placing the flash memory device in a test mode with an electronic key coupled to the flash memory device from the microprocessor, the electronic key comprising:

a supervoltage coupled to an input pin of the flash memory device from the microprocessor; and a code generated by the microprocessor and coupled to the address lines, the control lines, or the data lines coupled between the microprocessor and the flash memory device.

18. The method of claim 16 wherein coupling an external reference voltage comprises:

setting a latch circuit in a flash memory device having an array of floating gate memory cells to select a data width mode for the flash memory device;

coupling a BYTE input pin to an internal reference node through a bypass circuit in the flash memory device; and coupling an external reference voltage to the BYTE input pin in the flash memory device from a microprocessor.

19. An integrated circuit comprising:

an input pin to be coupled to an external reference voltage;

an internal reference circuit to be programmed to generate an internal reference voltage if the integrated circuit is not defective; and a control circuit to:

test the integrated circuit as the integrated circuit operates using the external reference voltage to determine if the integrated circuit is defective before the internal reference circuit is programmed; and test the integrated circuit as the integrated circuit operates using the internal reference voltage after the internal reference circuit is programmed to determine if the internal reference voltage is proper.

20. The integrated circuit of claim 19 wherein:

the integrated circuit comprises a flash memory device having an array of floating gate memory cells;

the input pin comprises an address input pin to be coupled to the external reference voltage;

the internal reference circuit comprises a first floating gate memory cell and a second floating gate memory cell to be programmed with pulses of varied duration;

the control circuit comprises a control circuit to write data to a floating gate memory cell in the flash memory device to test the flash memory device; and further comprising:

an input pin coupled to receive a supervoltage to place the flash memory device in a test mode; and inputs to be coupled to address lines, control lines, and data lines to receive a code to place the flash memory device in the test mode.

21. The integrated circuit of claim 19 wherein:

the integrated circuit comprises a flash memory device having an array of floating gate memory cells;

the flash memory device further comprises a latch circuit to be latched to select a data width mode for the flash memory device; and the input pin comprises a BYTE input pin to be coupled to an internal reference node through a bypass circuit and to be coupled to the external reference voltage.

22. A memory device comprising:

a plurality of memory cells and an input pin to be coupled to an external reference voltage;

an internal reference circuit to be programmed to generate an internal reference voltage if the memory device is not defective; and a control circuit to:

test the memory device as the memory device operates using the external reference voltage to determine if the memory device is defective before the internal reference circuit is programmed; and test the memory device as the memory device operates using the internal reference voltage after the internal reference circuit is programmed to determine if the internal reference voltage is proper.

23. The memory device of claim 22 wherein:

the memory device comprises a flash memory device having an array of floating gate memory cells;

the input pin comprises an address input pin to be coupled to the external reference voltage;

the internal reference circuit comprises a first floating gate memory cell and a second floating gate memory cell to be programmed with pulses of varied duration;

the control circuit comprises a control circuit to write data to a floating gate memory cell in the flash memory device to test the flash memory device; and further comprising:
an input pin coupled to receive a supervoltage to place the flash memory device in a test mode; and
inputs to be coupled to address lines, control lines, and data lines to receive a code to place the flash memory device in the test mode.

24. The memory device of claim 22 wherein:

the memory device comprises a flash memory device having an array of floating gate memory cells;

the flash memory device further comprises a latch circuit to be latched to select a data width mode for the flash memory device; and the input pin comprises a BYTE input pin to be coupled to an internal reference node through a bypass circuit and to be coupled to the external reference voltage.

25. A flash memory device comprising:

a plurality of floating gate memory cells and an input pin to be coupled to an external reference voltage;

an internal reference circuit to be programmed to generate an internal reference voltage if the flash memory device is not defective; and a control circuit to:
test the flash memory device as the flash memory device operates using the external reference voltage to determine if the flash memory device is defective before the internal reference circuit is programmed; and
test the flash memory device as the flash memory device operates using the internal reference voltage after the internal reference circuit is programmed to determine if the internal reference voltage is proper.

26. The flash memory device of claim 25 wherein:

the flash memory device has an array of the floating gate memory cells;

the input pin comprises an address input pin to be coupled to the external reference voltage;

the internal reference circuit comprises a first floating gate memory cell and a second floating gate memory cell to be programmed with pulses of varied duration;

the control circuit comprises a control circuit to write data to a floating gate memory cell in the flash memory device to test the flash memory device; and further comprising:
an input pin coupled to receive a supervoltage to place the flash memory device in a test mode; and
inputs to be coupled to address lines, control lines, and data lines to receive a code to place the flash memory device in the test mode.

27. The flash memory device of claim 25 wherein:

the flash memory device has an array of the floating gate memory cells;

the flash memory device further comprises a latch circuit to be latched to select a data width mode for the flash memory device; and the input pin comprises a BYTE input pin to be coupled to an internal reference node through a bypass circuit and to be coupled to the external reference voltage.

28. A system comprising:

a controller coupled to an integrated circuit by a plurality of lines, the integrated circuit comprising:
an input pin to be coupled to an external reference voltage;
an internal reference circuit to be programmed to generate an internal reference voltage if the integrated circuit is not defective; and
a control circuit to:
test the integrated circuit as the integrated circuit operates using the external reference voltage to determine if the integrated circuit is defective before the internal reference circuit is programmed; and
test the integrated circuit as the integrated circuit operates using the internal reference voltage after the internal reference circuit is programmed to determine if the internal reference voltage is proper.

29. The system of claim 28 wherein:

the controller comprises a microprocessor;

the lines comprise address lines, data lines, and control lines;

the integrated circuit comprises a flash memory device having an array of floating gate memory cells;

the input pin comprises an address input pin to be coupled to the external reference voltage through one of the address lines;

the internal reference circuit comprises a first floating gate memory cell and a second floating gate memory cell to be programmed with pulses of varied duration;

the control circuit comprises a control circuit to write data to a floating gate memory cell in the flash memory device to test the flash memory device; and further comprising:
an input pin coupled to receive a supervoltage over a line from the microprocessor to place the flash memory device in a test mode; and
inputs coupled to the address lines, control lines, and data lines to receive a code from the microprocessor to place the flash memory device in the test mode.

30. The system of claim 28 wherein:

the controller comprises a microprocessor;

the lines comprise address lines, data lines, and control lines;

the integrated circuit comprises a flash memory device having an array of floating gate memory cells;

the flash memory device further comprises a latch circuit to be latched to select a data width mode for the flash memory device; and the input pin comprises a BYTE input pin to be coupled to an internal reference node through a bypass circuit and to be coupled to the external reference voltage through a line from the microprocessor.

31. A system comprising:

a controller coupled to a memory device by a plurality of lines, the memory device comprising:
a plurality of memory cells;
an input pin to be coupled to an external reference voltage;
an internal reference circuit to be programmed to generate an internal reference voltage if the memory device is not defective; and
a control circuit to:
test the memory device as the memory device operates using the external reference voltage to determine if the memory device is defective before the internal reference circuit is programmed; and test the memory device as the memory device operates using the internal reference voltage after the internal reference circuit is programmed to determine if the internal reference voltage is proper.

32. The system of claim 31 wherein:

the controller comprises a microprocessor;

the lines comprise address lines, data lines, and control lines;

the memory device comprises a flash memory device having an array of floating gate memory cells;

the input pin comprises an address input pin to be coupled to the external reference voltage through one of the address lines;

the internal reference circuit comprises a first floating gate memory cell and a second floating gate memory cell to be programmed with pulses of varied duration;

the control circuit comprises a control circuit to write data to a floating gate memory cell in the flash memory device to test the flash memory device; and further comprising:

an input pin coupled to receive a supervoltage over a line from the microprocessor to place the flash memory device in a test mode; and inputs coupled to the address lines, control lines, and data lines to receive a code from the microprocessor to place the flash memory device in the test mode.

33. The system of claim 31 wherein:

the controller comprises a microprocessor;

the lines comprise address lines, data lines, and control lines;

the memory device comprises a flash memory device having an array of floating gate memory cells;

the flash memory device further comprises a latch circuit to be latched to select a data width mode for the flash memory device; and the input pin comprises a BYTE input pin to be coupled to an internal reference node through a bypass circuit and to be coupled to the external reference voltage through a line from the microprocessor.

34. A system comprising:

a controller coupled to a flash memory device by a plurality of lines, the flash memory device comprising:

a plurality of floating gate memory cells;

an input pin to be coupled to an external reference voltage;

an internal reference circuit to be programmed to generate an internal reference voltage if the flash memory device is not defective; and a control circuit to:

test the flash memory device as the flash memory device operates using the external reference voltage to determine if the flash memory device is defective before the internal reference circuit is programmed; and test the flash memory device as the flash memory device operates using the internal reference voltage after the internal reference circuit is programmed to determine if the internal reference voltage is proper.

35. The system of claim 34 wherein:

the controller comprises a microprocessor;

the lines comprise address lines, data lines, and control lines;

the flash memory device has an array of the floating gate memory cells;

the input pin comprises an address input pin to be coupled to the external reference voltage through one of the address lines;

the internal reference circuit comprises a first floating gate memory cell and a second floating gate memory cell to be programmed with pulses of varied duration;

the control circuit comprises a control circuit to write data to a floating gate memory cell in the flash memory device to test the flash memory device; and further comprising:

an input pin coupled to receive a supervoltage over a line from the microprocessor to place the flash memory device in a test mode; and inputs coupled to the address lines, control lines, and data lines to receive a code from the microprocessor to place the flash memory device in the test mode.

36. The system of claim 34 wherein:

the controller comprises a microprocessor;

the lines comprise address lines, data lines, and control lines;

the flash memory device has an array of the floating gate memory cells;

the flash memory device further comprises a latch circuit to be latched to select a data width mode for the flash memory device; and the input pin comprises a BYTE input pin to be coupled to an internal reference node through a bypass circuit and to be coupled to the external reference voltage through a line from the microprocessor.

* * * * *